United States Patent [19]
Kresge et al.

[11] Patent Number: 6,059,579
[45] Date of Patent: May 9, 2000

[54] SEMICONDUCTOR STRUCTURE INTERCONNECTOR AND ASSEMBLY

[75] Inventors: John S. Kresge, Binghamton; Scott P. Moore, Apalachin; Robin A. Susko, Owego; James W. Wilson, Vestal, all of N.Y.

[73] Assignee: International Business Machines Corporation, Armonk, N.Y.

[21] Appl. No.: 08/936,240

[22] Filed: Sep. 24, 1997

[51] Int. Cl.⁷ ........................................ H01R 9/09
[52] U.S. Cl. ............................................. 439/66
[58] Field of Search ............................... 439/66, 74, 70

[56] References Cited

U.S. PATENT DOCUMENTS

| Re. 28,379 | 3/1975  | Backhurst et al. | 204/20 |
|------------|---------|------------------|--------|
| 3,541,222  | 11/1970 | Parks et al.     | 439/66 |
| 3,654,098  | 4/1972  | Backhurst et al. | 204/20 |
| 3,971,610  | 7/1976  | Buchoff et al.   | 339/17 R |
| 4,943,355  | 7/1990  | Patterson        | 204/20 |
| 4,993,957  | 2/1991  | Shino            | 439/86 |
| 5,075,038  | 12/1991 | Cole et al.      | 252/514 |
| 5,155,301  | 10/1992 | Mase             | 439/66 |
| 5,487,999  | 1/1996  | Farnworth        | 437/7  |
| 5,531,942  | 7/1996  | Gilleo et al.    | 264/5  |
| 5,808,875  | 9/1998  | McMahon et al.   | 439/66 |
| 5,819,406  | 10/1998 | Yoshizawa        | 439/66 |

FOREIGN PATENT DOCUMENTS 5-62981   3/1993   Japan ........................... H01L 21/321

*Primary Examiner*—Khiem Nguyen
*Assistant Examiner*—J. F. Duverne
*Attorney, Agent, or Firm*—Heslin & Rothenberg, P.C.

[57] ABSTRACT

An assembly and process for connecting opposed semiconductor structures (12,14) comprising at least two structures. An interconnect (16) between the structures (12,14) connects the structures in opposed spaced relation to each other. The interconnect comprises a first material (18) and a second material (20). The first material comprises a resiliently flexible center portion. The second material comprises an electrically conductive outer portion surrounding the first material. The second material and the first material provide the interconnect with a flexibly compliant characteristic for maintaining an electrically conductive relationship between the structures.

15 Claims, 2 Drawing Sheets

SEMICONDUCTOR STRUCTURE INTERCONNECTOR AND ASSEMBLY

FIELD OF THE INVENTION

This invention relates generally to an interconnect for connecting one structure to another structure. More specifically, this invention relates to an assembly and method for reducing the effects of thermal expansion stress when two semiconductor structures are mechanically bonded and electrically connected together.

BACKGROUND OF THE INVENTION

Current semiconductor interconnection technology involves mounting integrated circuit (IC) chips on chip carriers like ceramic substrates or assembling the chips into plastic packages. Additionally, interconnection technology often involves mounting the chip and carrier combination on a circuit card. These interconnected components are then used in a variety of electronic applications such as computers, hand held electronic devices and the like. In these applications the useful life of a product often depends on the integrity of the connects interconnecting the components. For the interconnects not only may provide mechanical means for bonding the components together but they also provide the vital electrical paths between the components.

There are three principal systems for connecting IC chips to carriers and a chip and carrier combination to a circuit card. Each system provides both mechanical bonding and electrical connections between the connected structures.

One system is termed a flip-chip bonding system, where metal bumps on the face of the IC chip are connected to metal pads formed on a chip carrier. Interconnection here is typically made by solder bumps (a lead and tin mixture), that comprise a so-called "controlled collapse chip connect" or "C4".

Another system comprises use of solid metal balls, typically to connect a carrier/substrate to a circuit card. In the solid metal ball system, the balls can be composed of copper, gold, aluminum, or solder (such as a 3% tin 97% lead mixture). For assembly, a mask is placed over the substrate or wherever one wants to attach the balls. By readily known processes in the art, the mask either has or is made to have, recesses corresponding to electrical contacts on the substrate. Next, dots of solder are located on the electrical contacts, or alternatively formed before the mask step. The mask surface is then flooded with metal balls, each recess filling with a single metal ball, the excess balls rolling away. Then the balls and the substrate are heated through an ordinary reflow operation causing the balls to bond to the solder dots on the electrical contact. If desired, the mask can be removed. The substrate is then position together with a circuit card so corresponding electrical contacts with solder dots can be connected. The substrate and card are then compressed together and heated to again reflow the metal balls and interconnect the two via the metal balls interconnecting their electrical contacts.

More recently, a third aspect to the existing interconnection systems has come about for interconnecting substrates, namely, conductive adhesives and conductive adhesive balls. For example, adhesive balls eliminate the need for reflowing that traditional metal balls require to interconnect the substrates. The adhesive itself serves to mechanically bond the substrates and electrical connection is made from the substrate electrical contact through the adhesive ball to the electrical contact of the other substrate. Further, in the metal ball system, now dots of conductive adhesive can be used in place of the solder dots. In this way, heating and reflow is not necessary to interconnect the opposing structures. Rather, once the metal balls fill the mask, the two substrates can be pressed together and the adhesive between the electrical contacts and opposite sides of the balls allowed to cure, thereby mechanically bonding and electrically connecting the opposed structures.

There are several problems inherent with the existing interconnection methods and apparatus, and in particular, there is one common problem seen throughout. This problem resides in the basic principle that different structures or substrates, e.g., the IC chip, the carrier and the interconnect itself, often have different thermal expansion characteristics when exposed to the same temperatures. Thus, over time with exposure to everyday operational temperature changes, fatigue tends to corrupt the integrity of the interconnect joining the two structures, causing electrical failure between the structures.

One solution to such a problem would be to maintain the interconnected structures in a stress-free environment during their useful lifetime. Ideally, this means that any and all possible stress factors that could affect the structures or their interconnects must be eliminated. In practice, this is virtually impossible and where possible, only at great expense. Consequently, a more reasonable solution to this problem is needed.

These and other types of interconnection systems and components disclosed in the prior art do not offer the flexibility and inventive features of our invention. As will be described in greater detail hereinafter, the apparatus and methods of the present invention differ from those previously proposed.

SUMMARY OF THE INVENTION

In accordance with the features of the present invention, as described hereafter, it is an object of this invention to relieve thermal expansion stress between two structures having different thermal expansion characteristics.

It is a further object of the present invention to provide a cost effective reliable way to flexibly interconnect opposed structures for better maintaining continuous electrical connection therebetween.

It is still a further object of this invention to provide the interconnects with a bi-material construction having a compliant center portion and compliant conductive metal shell.

It is still a further object of this invention to provide a plurality of interconnects assembled in a pre-form interposer as a unit for positioning between opposed structures.

It is yet a further object of this invention to provide a method for making the interconnects and connecting the opposed structures via a plurality of such interconnects.

To achieve these and other features and objects of our invention, we have provided an assembly for connecting opposed structures. This assembly comprises at least two structures. An interconnect is located between the structures and connects the structures in opposed spaced relation to each other. The interconnect comprises a first material and a second material. The first material comprises a resiliently flexible center portion. The second material comprises an electrically conductive outer portion surrounding the first material. The configuration of the second material to the first material providing the interconnect with a flexibly compliant characteristic for maintaining an electrically conductive relationship between the structures.

Yet another feature of our invention is directed to each structure having an associated thermal expansion characteristic, with the center portion and the outer portion of the interconnect being integrally connected to enhance the flexibly compliant characteristic of the interconnect for absorption of a thermal expansion difference between the opposed structures when the opposed structures are exposed to a temperature change.

Still other features of our invention concern the construction of the interconnect. Such construction may include the center portion having a hollow interior portion to further enhance the resilient flexibility of the interconnect. Also, the construction may comprise constructing the center portion of a non-conductive material like a conformable polymer and the outer material of a metal. Further the construction may concern the shape of the interconnect to utilize existing manufacturing standards.

Other features of our invention concern a process for making an interconnected assembly of opposed structures. Such process comprises providing at least two structures, each structure having an associated thermal expansion characteristic; forming a first material having a resiliently flexible center portion; coating said first material with a second material to form an interconnect having an electrically conductive outer shell surrounding the center portion wherein the first material and the second material are capable of absorbing a thermal expansion difference between the associated thermal expansion characteristics when the structures are exposed to a temperature change; creating a plurality of such interconnect; and connecting the structures in spaced relation to each other via the plurality of said interconnect between the structures.

Still other features of our invention concern the process for making the an interconnect assembly, itself, comprising forming a first material having a resiliently flexible center portion; coating said first material with a second material to form an interconnect having an electrically conductive outer shell surrounding the center portion, the configuration of the first material and the second material providing a flexibly compliant characteristic for maintaining an electrical connection between a pair of opposed structures; creating a plurality of such interconnects; and placing the plurality in an insulative material.

BRIEF DESCRIPTION OF THE DRAWINGS

Other objects, features and advantages of our invention will become more readily apparent upon reference to the following description when taken in conjunction with the accompanying drawings, which drawings illustrate several embodiments of our invention.

DETAILED DESCRIPTION OF THE PREFERRED EMBODIMENT

Figure 1:
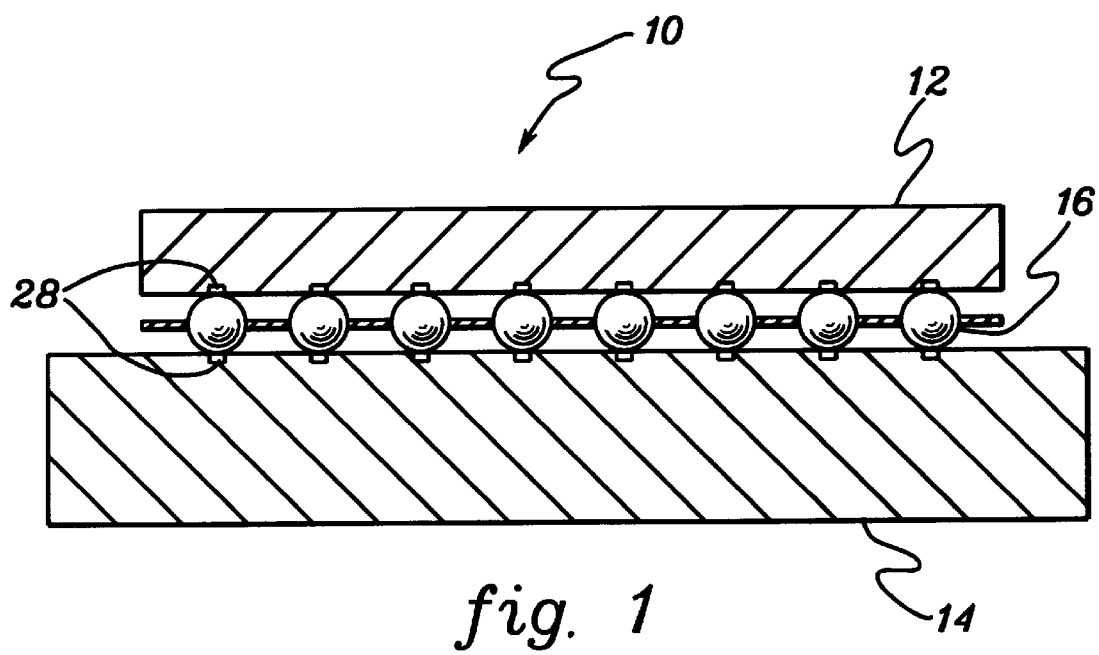
FIG. 1 is a cut away side view of a preferred embodiment of our invention in an assembled form employing an insulative medium to position a plurality of interconnects.

Referring now to the drawings, FIG. 1 shows a preferred embodiment our new and improved structure or substrate interconnection system or assembly 10. The assembly comprises a first structure 12 connected to a second structure 14. A plurality of interconnects 16 electrically connect the two structures and mechanically bond them together. Each interconnect connects to a respective structure at an electrical contact 28. Excellent results are achieved when the structures 12 and 14 comprise an IC chip, a carrier/substrate, a circuit card or the like. However, it should be understood that the claimed features and advantages of our invention may by employed to interconnect other semiconductor structures.

Figure 2:
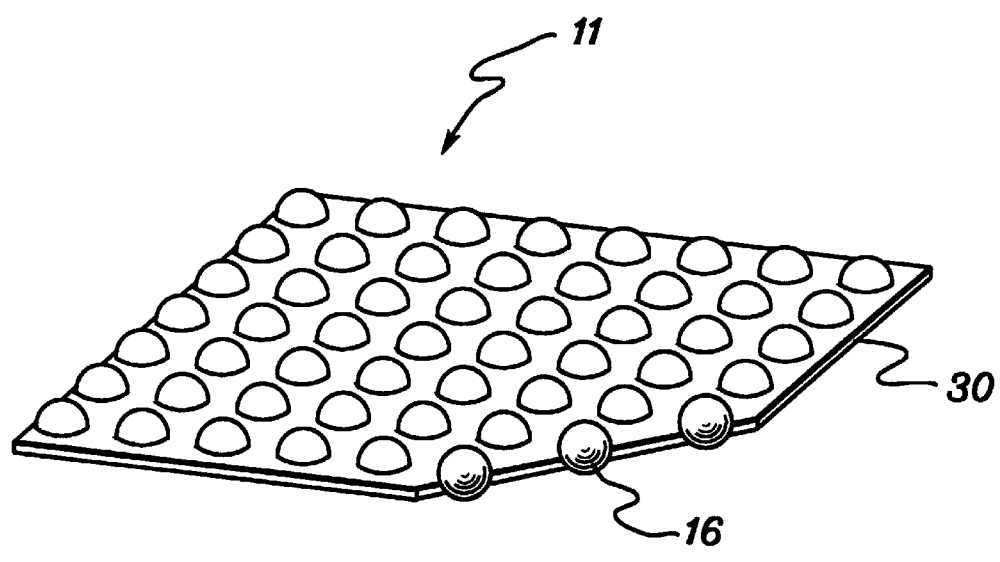
FIG. 2 is a partial perspective view of another embodiment of our invention comprising an interconnect assembly of interconnects supported in an insulative material.

As seen in FIGS. 1 and 2, the interconnects may be supported in an insulative material 30. In this way, the interconnects are pre-assembled in the material 30 to aid in placement of the interconnects between the opposed structures 12 and 14 before mechanical bonding therebetween. Additionally, in the pre-assembled form, the interconnects and material 30 comprise a unit that can be separately assembled and sold remotely from the structures for which an interconnect assembly 11 of interconnects 16 may be used to interconnect. Excellent results are obtained when the insulative material comprises a rubber or rubber-like material. However, it should be understood that other materials would work equally as well provided they have an insulative quality for preventing electrically connection of one interconnect to another and adequately retain the interconnects therein.

As presently contemplated, the interconnects could be placed in the insulative material by sizing holes in the material of sufficient diameter to retain the interconnects once inserted therein. However, other means could achieve the same purpose of supporting the interconnects in a pre-assembled unit. Also, although the pre-assembled unit shown here is square and grid like, any desired array of a linear or non-linear configuration could be employed.

Figure 3:
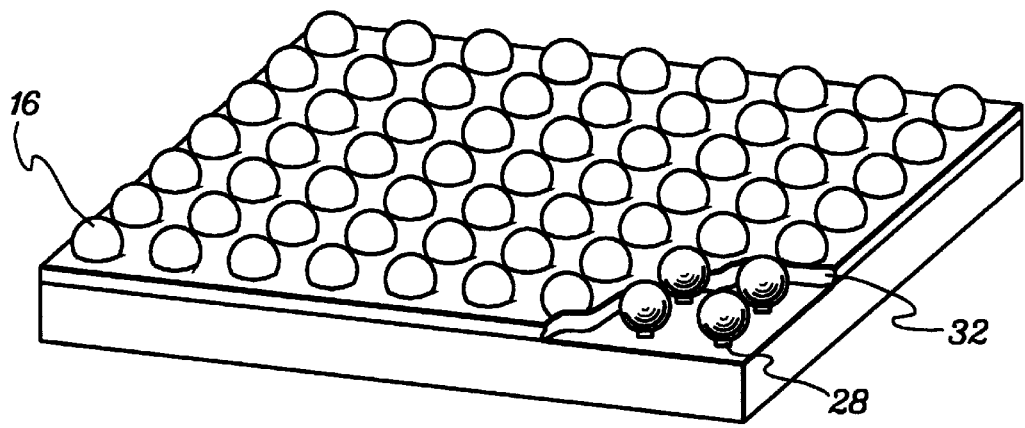
FIG. 3 is a perspective view of a plurality of interconnects positioned on a structure via a mask.

Turning to FIG. 3, another embodiment of our invention is seen. Here the interconnects 16 are positioned over the electrical contacts 28 by use of a mask 32. The mask 32 may comprise any conventional masking structure and system readily know in the art for positioning of metal balls and the like.

In FIGS. 4A–4D various embodiments of the interconnects 16 are seen in detail. In each, the interconnect 16 comprises a first material 18 surrounded by a second material 20. In a preferred embodiment of our invention, the first material comprises a resiliently flexible center portion and the second material comprises an electrically conductive outer portion or outer shell. Excellent results are obtained when the first material is a conformable polymer material and specifically latex. Further excellent results are obtained when the second material is a metal, and specifically a ductile metal such as copper, gold or nickel.

Figure 4A:
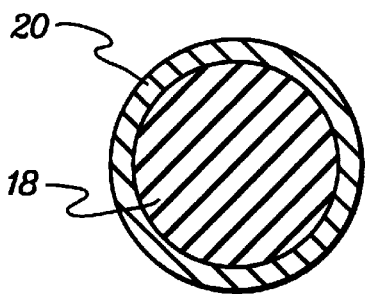
FIG. 4A is an enlarged cut away side view of an interconnect in accordance with the present invention.
Figure 4B:
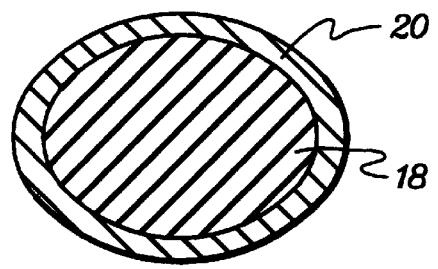
FIG. 4B is an enlarged cut away side view of another embodiment of an interconnect in accordance with the present invention.
Figure 4C:
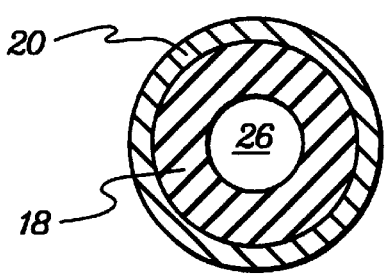
FIG. 4C is an enlarged cut away side view of yet another embodiment of an interconnect in accordance with the present invention.
Figure 4D:
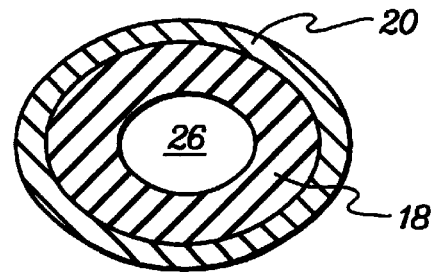
FIG. 4D is an enlarged cut away side view of still another embodiment of an interconnect in accordance with the present invention.

In an alternative embodiment of our interconnect 16, seen in FIGS. 4C and 4D, the first material 18 has a hollow interior portion 26. This portion 26 further enhances the resilience and flexibility of the interconnect during its useful lifetime for interconnecting opposed structures. Depending on the application desired for the interconnects, they may take a variety of shapes, such as a substantially spherical ball-like configuration in FIGS. 4A and 4C or oblong or oval as seen in FIGS. 4B and 4D.

Presently, we contemplate that the interconnects 16 could be formed by any readily known process for the formation of metal coated spheres, such as electrolessly plating, barrel plating or other methods known in the art. A critical aspect to the interconnect is not the formation process itself, but the production of an interconnect having a flexibly compliant center portion coated with a sufficient layer of conductive material, and preferably metal for mechanically bonding and electrically interconnecting opposed structures. It is this combination that utilizes the excellent electrical conductivity features of a material such as metal, without limits of a rigidly solid cored interconnect. In this way, the configuration of the flexibly complaint center portion coated with a metal layer provides the interconnect with an overall flexibly compliant characteristic for maintaining an electrically conductive relationship between the structures 12,14.

Stated differently, it is generally accepted that metals provide reliable connection between electrical contacts. Also, it is readily know that metals have certain compliance or elasticity characteristics. However, existing uniformly solid cored metal interconnects such as existing metal balls have proven to be insufficient to withstand the effects of thermal expansion inherent in connected opposed structures. That is, interconnects on the order of 3 to 4 mils in diameter for chip to substrate/carrier connection and 25 to 30 mils in diameter for substrate/carrier to circuit card, become fatigued and break electrical connection between opposed structures, simply due to the stresses or forces of thermal expansion between opposed interconnected structures.

In a preferred embodiment of our invention, the interconnect assembly combines the preferred electrical interconnect features of a metal with enhanced compliance and elasticity characteristics provided by a flexibly compliant, preferably non-metal, core. Further, these features are achieved in a small compact interconnect on the order of 3 to 30 mils, depending on the desired application. This combination of materials provides each interconnect itself, and the assembly as a whole, with a flexibly compliant characteristic for absorption of a thermal expansion difference between opposed structures when exposed to a temperature change, which results in maintaining electrical connection of the structures in spite of thermal expansion forces. Also, excellent results are achieved when the center portion 18 not only provides the interconnect with a flexibly compliant core, but also integrally bonds to the outer portion or shell 20 to further enhance the range of flexibility and elasticity of the outer portion in operation.

Our invention further comprises a process for making the interconnect assembly 11 of interconnects 16 (generally FIG. 2). This process comprises forming a first material 18 comprising a resiliently flexible center portion. As presently contemplated, the center portion is formed using any existing process for forming microspheres. Next, the center portion is coated with a second material to form an interconnect having an electrically conductive outer shell surrounding the center portion. Again, it is contemplated that coating of the spheres may take place using readily known processes in the art such as electroless plating or barrel plating. In this embodiment of our invention a plurality of such interconnects are created and then they are placed in an insulative material 30, such as previously described.

Depending on the intended use for the interconnect assembly 11 the step for coating the interconnects may also include further coating the second material with a solder. In this way, the interconnect assembly can be placed as a unit between opposed structures, such as 12 and 14, and the solder reflowed to interconnect the structures.

Alternatively, the step of coating the interconnects may comprise coating the second material with an adhesive, and preferably a conductive adhesive. In this way, the interconnect assembly can be placed as a unit between opposed structures, such as 12 and 14, the structures compressed and the adhesive cured to interconnect the structures.

Yet another aspect of our invention includes a process for making an interconnected assembly 10 of opposed structures. This process may utilize an interconnect assembly 11, however, it is not necessary. Under this process at least two structures 12 and 14, usually semiconductor structures as readily known in the art, are provided with each structure having an associated thermal expansion characteristic. Next, a first material 18 comprising a resiliently flexible center portion is formed. Then the first material is coated with a second material 20 to form an interconnect having an electrically conductive outer shell surrounding the center portion. In this way, the configuration of the first material and the second material are capable of absorbing a thermal expansion difference between the associated thermal expansion characteristics when the structures 12 and 14 are exposed to a temperature change. A plurality of such interconnects are then created and connected to the structures such that the structures are mechanically bonded and electrically connected in spaced relation to each other via the plurality of interconnects located between the structures.

Under this process, the interconnects may be bonded to the structures 12 and 14 in a variety of ways. For example, the process may include coating the outer shell with solder. Then, a mask 32 may be placed over the structure, by processes readily know in the art. Next, the mask is flooded with solder covered interconnects 16, as previously described, the solder is flowed and the mask removed, if desired. Finally, the second structure is compressed to the interconnects of the first structure and the solder is again reflowed to bond the interconnects to the second structure, thereby electrically interconnecting the two structures.

An alternative step for connecting the structures 12 and 14 may comprise using an insulative medium and pre-assembled interconnects with either solder or conductive adhesive as the bonding material between the interconnects and the structures 12 and 14, as described above.

Yet another alternative may comprise utilizing a mask in combination with a conductive adhesive. It should be understood that as contemplated in our invention, the structures 12 and 14 comprising semiconductor structures have a plurality of electrical contacts at a respective surfaces of each, usually referred to as bonding pads. Under this alternative, the next step is to apply a conductive adhesive to each of the plurality of electrical contacts of the two structures. Then, using the mask technique as previously described, a plurality of interconnects are flooded over the mask, with recesses above the electrical contacts, and the loose interconnects roll away. Next, the second structure is positioned over the first structure as desired to match up electrical contacts with the interconnects on the first structure. The two structures are then compressed together in a manner and for a time sufficient to cure the conductive adhesive, thereby mechanically bonding and electrically connecting the two structures in a compliant flexible relationship.

Finally, in an embodiment of the present invention, as broadly shown in FIG. 1, the opposed structures 12 and 14 are mechanically bonded to each other only via the interconnects and otherwise their surfaces do not contact and are maintained in spaced apart relation. Also, it should be understood further that the positioning of the structures 12 and 14 need not be co-planar across their entire surfaces, as shown in the drawings. Non-planar configurations could be employed and the features and advantages of our invention employing our interconnects and interconnect assembly would fall within the scope of our disclosed and claimed invention.

As various possible embodiments may be made in the above invention for use for different purposes and as various changes might be made in the embodiments and method above set forth, it is understood that all of the above matters here set forth or shown in the accompanying drawings are to be interpreted as illustrative and not in a limiting sense.

We claim:

1. An assembly of interconnected structures comprising:
   at least two structures;
   at least one interconnect between the structures mechanically connecting the structures together in opposed spaced relation to each other;
   said interconnect comprising a first material and a second material;
   the first material comprising a resiliently flexible center portion;
   the second material comprising an electrically conductive outer portion surrounding the first material; and
   the configuration of the second material and the first material providing the interconnect with a flexibly compliant characteristic for electrically connecting and maintaining an electrically conductive relationship between the structures wherein the interconnect comprises the only mechanical support connecting the structures in opposed spaced relation to each other.

2. The assembly of claim 1, wherein each structure has an associated thermal expansion characteristic and the center portion and the outer portion are integrally connected enhancing the flexibly compliant characteristic of the interconnect device for absorption of a thermal expansion difference between the structures when said structures are exposed to a temperature change.

3. The assembly of claim 1, wherein the center portion has a hollow interior portion located therein.

4. The assembly of claim 1, further in combination with a plurality of said at least one interconnect, each interconnect of the plurality selectively spaced apart from each other.

5. The assembly of claim 4, wherein the plurality of interconnects are adjacent substantially only interconnects having a similar flexibly compliant characteristic.

6. The assembly of claim 4, wherein the plurality of interconnects are pre-assembled in an insulative material and each interconnect is held in spaced relation apart from each other.

7. The assembly of claim 4, wherein a conductive adhesive is attached to the outer portion of each interconnect of said plurality of interconnects.

8. The assembly of claim 4, wherein a solder is attached to the outer portion of each interconnect of said plurality of interconnects.

9. The assembly of claim 1, wherein the interconnect device is spherical or oblong-spherical and the center portion is constructed of a conformable polymer material.

10. The assembly of claim 9, wherein the conformable polymer material comprises latex.

11. The assembly of claim 1, wherein the interconnect device is spherical or oblong-spherical and the outer portion is constructed of a metal from the group consisting of copper, gold and nickel.

12. An assembly of mechanically and electrically connected semiconductor structures comprising:
    a first structure having a first thermal expansion characteristic;
    a second structure having a second thermal expansion characteristic;
    a plurality of electrical contacts located on the first and second structures;
    a plurality of interconnects spaced apart from each other;
    the plurality of interconnects selectively connecting the plurality of electrical contacts together mechanically;
    each interconnect of the plurality of interconnects comprising a first material and a second material enclosing the first material, the second material electrically connecting the first and second structures together via at least the plurality of electrical contacts; and
    wherein the first and second materials of each interconnect yield to a thermal expansion difference between the first and second structures when the first and second structures are exposed to a temperature change and the first and second materials maintain electrical connection between the first and second structures and wherein the plurality of interconnects comprise the only mechanical supports connecting the first and second structures together.

13. The assembly of claim 12, wherein the interconnect is spherical or oblong-spherical and the first material is non-conductive.

14. The assembly of claim 12, wherein each interconnect is pre-assembled in an insulative material.

15. An interconnect for mechanically and electrically connecting opposed structures comprising:
    a first material and a second material;
    the first material comprising a resiliently flexible center portion;
    the resiliently flexible center portion having a hollow interior portion located therein;
    the second material comprising an electrically conductive outer portion surrounding the first material; and
    the first and second materials providing the interconnect with a flexibly compliant characteristic for maintaining an electrical connection between a pair of opposed structures when the interconnect is connected therebetween.

* * * * *

UNITED STATES PATENT AND TRADEMARK OFFICE
CERTIFICATE OF CORRECTION

PATENT NO. : 6,059,579
DATED : May 9, 2000
INVENTOR(S) : Kresge et al.

It is certified that error appears in the above-identified patent and that said Letters Patent is hereby corrected as shown below:

ON THE TITLE PAGE:

Item [57] ABSTRACT: Line 2, after "two structures" insert --(12,14)--.

Line 3, delete "(12,14)".

Signed and Sealed this

Twentieth Day of March, 2001

Attest:

NICHOLAS P. GODICI

*Attesting Officer*  *Acting Director of the United States Patent and Trademark Office*